United States Patent [19]

Phillips

[11] 4,142,163
[45] Feb. 27, 1979

[54] SURFACE ACOUSTIC WAVE DEVICE WITH REDUCED SPURIOUS RESPONSES

[75] Inventor: William Phillips, Princeton, N.J.

[73] Assignee: RCA Corporation, New York, N.Y.

[21] Appl. No.: 854,203

[22] Filed: Nov. 23, 1977

[51] Int. Cl.² .................. H03H 9/26; H03H 9/30; H03H 9/32; H01L 41/18
[52] U.S. Cl. .................................. 333/72; 29/25.35; 252/62.9; 310/313; 333/30 R
[58] Field of Search .................. 333/72, 30 R, 71; 310/313; 331/107 A; 330/5.5; 29/25.35; 252/62.9

[56] References Cited

U.S. PATENT DOCUMENTS 4,047,130   9/1977   Lim et al. .......................... 333/72

Primary Examiner—Alfred E. Smith
Assistant Examiner—Marvin Nussbaum
Attorney, Agent, or Firm—H. Christoffersen; Birgit E. Morris

[57] ABSTRACT

This invention relates to a surface acoustic wave device which is comprised of a single domain lithium niobate layer on a multiple domain lithium niobate substrate. On the single domain layer are launching and receiving interdigitated electrode patterns. Spurious responses generated by bulk waves from the launching electrode and transmitted to the receiving electrode are substantially reduced.

10 Claims, 2 Drawing Figures

SURFACE ACOUSTIC WAVE DEVICE WITH REDUCED SPURIOUS RESPONSES

BACKGROUND OF THE INVENTION

Surface acoustic wave devices which are comprised of a launching and receiving interdigitated electrode pattern on a single crystal substrate such as lithium niobate or lithium tantalate may be used in TV applications to eliminate stray interference signals from TV intermediate frequency signals. The signal is fed to the launching electrode which generates surface acoustic waves. The surface acoustic waves corresponding to the intermediate frequency signals are received by the receiving electrode but the stray interference signals are not received and, hence, are screened from the intermediate frequency signal. The launching electrode, however, in addition to generating a surface acoustic wave also generates bulk waves. These bulk waves may be reflected from the bottom or sides of the crystal and received by the receiving electrode as spurious responses. It has, thus, been desired to have a surface acoustic wave device which will filter out interference signals but will not produce spurious responses from bulk waves.

SUMMARY OF THE INVENTION

A surface acoustic wave device is comprised of a single domain lithium niobate layer on a multiple domained lithium niobate substrate. Launching and receiving interdigitated electrode patterns are on the single domain layer. The surface acoustic wave device will filter stray interference signals and reduces spurious responses due to bulk waves.

DETAILED DESCRIPTION OF THE INVENTION

Figure 1:
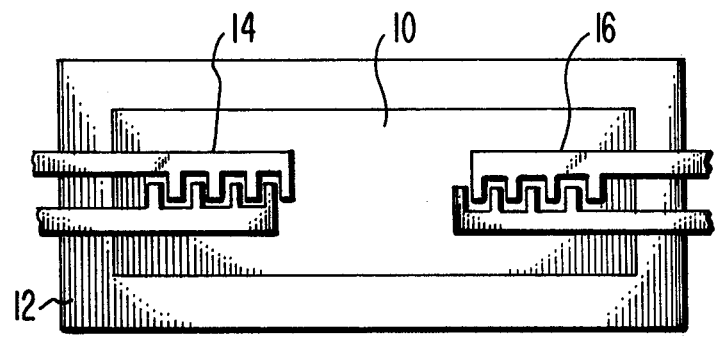
FIG. 1 is a top view schematic illustration of a surface acoustic wave device of the invention.
Figure 2:
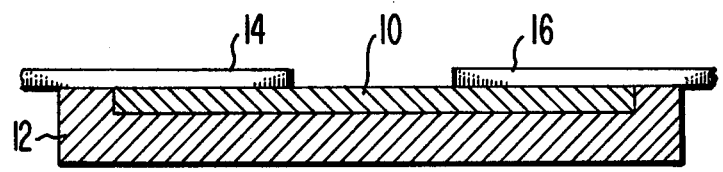
FIG. 2 is a cross sectional schematic illustration of a surface acoustic wave device of the invention.

In FIG. 1 and FIG. 2 a single domain lithium niobate layer 10 is located on a multiple domain lithium niobate substrate 12. Suitably, the substrate 12 is a rectangular solid about 1 cm × 0.5 cm × 250 micrometers thick. The single domain layer 10 is about 0.5 cm × 0.3 cm with a thickness approximately equal to the acoustic wavelength at the frequency of operation. A thickness of about 10 to 100 micrometers is suitable when TV intermediate frequencies of about 40 to 80 megahertz are employed.

The diameter of the domains in the multiple domain lithium niobate substrate 12 are suitably equal to or greater than the wavelength of the bulk waves produced by the launching electrode 14. When TV intermediate frequencies are employed, suitable domain diameters are about 50 to 100 micrometers or greater. As the launching electrode 14 transmits intermediate frequency signals, bulk waves are also propagated which travel through the single domain layer 10 and into the multiple domain lithium niobate substrate 12. According to the present invention, as the bulk waves travel through the multiple domain substrate they are dissipated by the boundaries between the domains and, hence, are not reflected back to a receiving interdigitated electrode 16. Thus the intermediate frequency of the input signal into electrode 14 is transmitted to the receiving electrode 16 with spurious responses from the bulk waves reduced or eliminated.

In addition to spurious responses generated by bulk waves, spurious responses may also be caused by surface acoustic waves which are generated by the launching electrode 14 and are reflected from the sides or back of the single domain layer 10. In the embodiment of the invention shown in FIG. 1, the single domain layer 10 is surrounded by the multiple domain substrate 12. When surface acoustic waves are propagated towards the side or back of the single domain layer 10 they are dissipated by the domains in the multiple domain substrate 12 and, hence, are not reflected back to the receiving interdigitated electrode pattern 16.

The multiple domain substrate is prepared by a standard technique such as the Czochralski crystal growth technique. In this method mixtures of lithium oxide and niobium oxide, suitably congruent mixtures, are heated in a crucible and a crystal pulled from the melt. If the pulled crystal is poled by applying an electrical potential while the crystal is cooled from above its Curie temperature to below its Curie temperature, a single domain crystal of lithium niobate will form. If, however, the crystal is pulled from the melt and cooled without poling the crystal with an electrical potential, a multiple domain crystal will form. Crystals formed in this manner generally have domain diameters of approximately 50 to 400 micrometers. The domain diameters may be altered by heat treating the crystal. Annealing the crystal, for example, at 1200° C. and cooling to room temperature will reduce the domain diameter size to about 50 to 100 micrometers. Similarly a single domain crystal treated this way will become multiple domain. The crystal may be cut into a rectangular shape and employed as a substrate.

In order to form a single domain layer on the multidomain substrate, a metal is selected such that the metal, when diffused into the substrate, will lower the Curie temperature of the substrate. Suitable metals are transition metals such as cobalt and niobium. A rectangular pattern of metal is deposited onto the substrate using suitable techniques such as vacuum vapor deposition wherein the vapors in a vacuum are transmitted through a mask and deposited onto the substrate. The metal vapor deposition layer thicknesses are suitably from about 300 to 2000 angstroms and preferably from about 600 to 1000 angstroms.

The metal layer is then diffused into the substrate to a depth of about 20 to 40 micrometers by heating the substrate. The substrate must be heated to a temperature high enough to allow diffusion of the metal into the substrate, but below the Curie temperature of the substrate which is about 1150° C. Suitable temperatures are from about 1075° to 1105° C. The depth of diffusion is controlled by the time that the substrate remains at the diffusion temperature. For example, suitable diffusion will occur after about 3 to 5 hours at a temperature of about 1085° C.

The region of the multiple domain substrate into which the metal is diffused is altered into a single domain region by applying to the heated substrate an electrical field which is substantially parallel to the c-axis of the crystal. The temperature must remain below the Curie temperature of the substrate but be above the Curie temperature of the region of the substrate into which the metal has been diffused. When cobalt or niobium is employed, the Curie temperature of the diffused region is about 1075° C. The electric field is suitably D.C. current at 1.0 volt and 200 microamperes. The potential is applied by contacting two opposite sides of the substrate with an electrode. Normally these correspond to the plus and minus C faces of the crystal. The electrode may be applied directly to the sides of the substrate or a platinum paint may be applied to the sides of the substrate in order to increase the conductivity. With the electric field applied to the substrate, the substrate is cooled to below the Curie temperature of the region with the diffused metal. The region of the substrate having the diffused metal is formed into a single domain layer and the field may be removed.

In one embodiment of this invention a combination of cobalt and niobium is diffused into the multiple domain substrate. A layer of cobalt is vacuum evaporated onto a multiple domain substrate through a mask as described above. Niobium pentoxide is provided as a source of niobium, which may be niobium pentoxide coated on a substrate having its coated surface positioned approximately 5 millimeters above the evaporated cobalt layer. Both the niobium pentoxide block and the lithium niobate substrate are heated during the diffusion step which allows a combination of cobalt and niobium to diffuse into the lithium niobate substrate. The diffused region is then changed into a single domain layer as described above.

Interdigital electrode patterns for launching and receiving surface acoustic signals as shown in FIG. 1 are then applied to the single crystal layer by such techniques as vapor diffusion using a suitable electrode material such as gold.

I claim:
1. A surface acoustic wave device comprising:
   (a) a multiple domain lithium niobate substrate;
   (b) a single domain lithium niobate layer on a surface of said substrate;
   (c) a launching interdigitated electrode pattern on said layer; and
   (d) a receiving interdigitated electrode pattern on said layer.

2. A surface acoustic wave device according to claim 1 wherein the multiple domains in the substrate have diameters that are equal to or greater than about 50 to 100 micrometers.

3. A surface acoustic wave device according to claim 1 wherein the single domain layer is 10 to 100 micrometers thick.

4. A surface acoustic wave device according to claim 1 wherein the launching and receiving interdigitated electrode patterns are formed from gold.

5. A method for producing a surface acoustic wave device with reduced spurious responses which comprises:
   (a) depositing a metal layer on a multiple domain lithium niobate substrate wherein the metal will lower the Curie temperature of the substrate in which the metal is diffused;
   (b) diffusing the metal layer into the substrate;
   (c) heating the substrate to a temperature below the Curie temperature of the substrate but above the Curie temperature of the diffused layer;
   (d) applying an electrical field to the heated substrate while cooling below the Curie temperature of the diffused layer to form a single domain layer; and
   (e) forming launching and receiving interdigitated electrode patterns on the single domain layer.

6. A method according to claim 5 wherein the metal deposited on the substrate is a transition metal.

7. A method according to claim 5 wherein the metal deposited on the substrate is selected from niobium and cobalt.

8. A method according to claim 5 wherein the metal layer is diffused into the substrate by heating the substrate to a temperature of from about 1075° to 1105° C.

9. A method according to claim 5 wherein the diffused metal layer is diffused about 20 to 40 micrometers into the substrate.

10. A method according to claim 5 wherein the electrical field is about 1.0 volt and about 200 microampers of D.C. current.

* * * * *